(12) United States Patent
Utsugi et al.

(10) Patent No.: US 7,462,244 B2
(45) Date of Patent: Dec. 9, 2008

(54) DEVICE AND METHOD FOR VACUUM FILM FORMATION

(75) Inventors: Koji Utsugi, Tokyo (JP); Hironori Yamamoto, Tokyo (JP); Mariko Miyachi, Tokyo (JP); Tamaki Miura, Tokyo (JP); Mitsuhiro Mori, Tokyo (JP); Yutaka Bannai, Tokyo (JP); Ikiko Yamazaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/493,699

(22) PCT Filed: Nov. 21, 2002

(86) PCT No.: PCT/JP02/12210

§ 371 (c)(1),
(2), (4) Date: Apr. 27, 2004

(87) PCT Pub. No.: WO03/046246

PCT Pub. Date: Jun. 5, 2003

(65) Prior Publication Data

US 2005/0008778 A1 Jan. 13, 2005

(30) Foreign Application Priority Data

Nov. 27, 2001 (JP) ............................. 2001-361709

(51) Int. Cl.
*C23C 16/54* (2006.01)
(52) U.S. Cl. .................. 118/718; 118/720; 118/729
(58) Field of Classification Search ............. 427/248.1, 427/255.5; 118/718, 720, 729
See application file for complete search history.

(56) References Cited

U.S. PATENT DOCUMENTS

| 3,971,334 | A | * | 7/1976 | Pundsack ..................... 118/665 |
| 4,428,980 | A | * | 1/1984 | Nakamura et al. .......... 427/162 |
| 4,469,719 | A | * | 9/1984 | Martin ..................... 427/255.5 |
| 4,562,093 | A | * | 12/1985 | Mario et al. ................. 427/109 |
| 4,776,868 | A | * | 10/1988 | Trotter et al. ................ 65/17.4 |
| 5,264,256 | A | * | 11/1993 | Wozniak et al. ............. 427/535 |
| 5,298,282 | A | * | 3/1994 | Sugita et al. ................ 427/131 |
| 5,451,427 | A | * | 9/1995 | Takahashi et al. ........... 427/130 |
| 5,460,853 | A | * | 10/1995 | Hintz et al. ............... 427/255.5 |
| 5,591,481 | A | * | 1/1997 | Takahashi et al. ........... 427/131 |
| 5,670,224 | A | * | 9/1997 | Izu et al. .................... 428/35.8 |
| 5,879,519 | A | * | 3/1999 | Seeser et al. ........... 204/192.12 |
| 5,976,257 | A | * | 11/1999 | Kanai et al. ................. 118/718 |
| 6,096,389 | A | * | 8/2000 | Kanai ......................... 427/575 |
| 6,129,951 | A | * | 10/2000 | Ward-Close et al. ... 427/255.24 |
| 6,649,208 | B2 | * | 11/2003 | Rodgers ...................... 427/10 |

(Continued)

FOREIGN PATENT DOCUMENTS

JP          59-89764          5/1984

(Continued)

*Primary Examiner*—Bret Chen
(74) *Attorney, Agent, or Firm*—Young & Thompson

(57) ABSTRACT

A vacuum deposition apparatus is used for deposit evaporated substance from evaporation sources (6a and 6b) on the desired position of a flexible substrate (1). While the flexible substrate (1) is carried using rollers in a vacuum, shutters (8a and 8b) are opened and closed to control the movement of the evaporated substance via openings. A film having a desired shape of pattern is formed on the flexible substrate (1) with higher controllability.

5 Claims, 10 Drawing Sheets

U.S. PATENT DOCUMENTS

| | | | |
|---|---|---|---|
| 6,696,105 B2 * | 2/2004 | Hiroki et al. | 427/466 |
| 6,773,745 B2 * | 8/2004 | Arisaka et al. | 427/130 |
| 2004/0011288 A1 * | 1/2004 | Affinito | 118/718 |

FOREIGN PATENT DOCUMENTS

| | | |
|---|---|---|
| JP | 59-217233 | 12/1984 |
| JP | 59-217234 | 12/1984 |
| JP | 59217233 A * | 12/1984 |
| JP | 60-114569 | 6/1985 |
| JP | 61-250837 | 11/1986 |
| JP | 62-103360 | 5/1987 |
| JP | 5-78818 | 3/1993 |
| JP | 5-243182 | 9/1993 |
| JP | 11-29583 | 2/1999 |
| JP | 11-199107 | 7/1999 |
| JP | 11-250900 | 9/1999 |

\* cited by examiner

DEVICE AND METHOD FOR VACUUM FILM FORMATION

TECHNICAL FIELD

The present invention relates to a vacuum deposition apparatus and a vacuum deposition process for pattern-depositing a film on a substrate while carrying the substrate in a vacuum.

BACKGROUND TECHNOLOGY

Due to widespread use of mobile terminals such as cellular phones and notebook personal computers, the role of the secondary batteries used for the power source thereof has increased importance. The secondary batteries are requested to have smaller size, lighter weight and higher capacity along with the stronger demand for larger-capacity, higher-speed communications and higher-speed transmission of color moving pictures.

For achieving the higher capacity of the secondary batteries, it is important to develop the electrodes, especially the anode active material thereof. Lithium-ion secondary batteries, wherein a metallic lithium foil is formed as an anode active material on a conductive substrate such as a copper foil by using a vacuum deposition process and a protective film is formed thereon, and higher-capacity secondary batteries having composite electrodes therein, wherein an active material having a larger theoretical capacity, such as silicon, is formed on a carbon-based film by using a vacuum deposition process, have been manufactured by trial, in order to achieve a higher energy density. For obtaining electrodes for such a higher-capacity secondary battery, it is tried to form an active material, which may provide a higher capacity, by using the vacuum deposition technology.

For manufacturing a large number of secondary battery electrodes by using the vacuum deposition technology, a continuous vacuum deposition technique is used wherein a conductive substrate (supporting member), such as a copper foil, is continuously supplied. In addition, for assuring the contact between the conductive substrate and a tab, the portion of the conductive substrate on which the tab is formed is preferably a non-evaporated portion, and thus the continuous patterning deposition technique is used.

There is a known technique wherein a stripe belt mask having therein openings arranged at a constant pitch along the longitudinal direction of the mask is carried while being in close contact with a metallic stripe belt, in order to continuously form a film pattern on the metallic stripe belt (Patent-Publications JP-A-1984-6372, 1984-84516, and 2000-183500). In this technique, the subject substance is formed on the metallic stripe belt through the openings of the mask, followed by winding up the metallic stripe belt and the mask separately.

In the technique described in JP-A-1984-6372, it is difficult to deposit the evaporated substance on the specified position of the metallic stripe belt because there is a large possibility that the mask and the metallic stripe belt have slack or bending due to the influences from the gravity and the tension by the sprocket. If a large tension by the sprocket is selected to avoid the influences, the openings of the mask will be possibly deformed or the metallic stripe belt will be possibly cut-off during the deposition process. In particular, in the step of deposition on the metallic stripe belt other than the feeding and winding steps thereof (refer to page 6 and FIG. 6 in the publication), the influences are more likely to occur because there is no mechanism (such as guide roller or can roll) for moderately pressing the metallic stripe belt and the mask.

In the technique described in JP-A-2000-183500, although the mask and the substrate are carried along the guide roll (evaporation roll) for effecting the pattern-deposition, the evaporated substance is deposited onto the mask during the iterated deposition process, whereby the deposited, evaporated substance may possibly be peeled off during the carriage to cause contamination or pollution. In addition, there are other problems that the mask is likely to be displaced or bent during the carriage, similarly to the technique described in JP-A-1984-6372.

Moreover, in the patterning by using those masks, there is another problem that a portion of the film is peeled off at the step of separation of the metallic stripe belt from the mask. In either of these cases, there is a need for providing the winding-up mechanism for the mask in the vacuum chamber, which causes the problems of a larger volume of the apparatus or a complicated structure of the apparatus. Further, since the evaporated substance is deposited on the mask in a mass production, as described before, the mask should be either replaced or cleaned for reuse, which causes a lower throughput of the process.

As described heretofore, there are large difficulties to manufacture the secondary battery electrodes in a mass production by using the conventional vacuum deposition apparatus and deposition process to continuously form patterns of the electrode active material for the secondary batteries on the conductive substrate such as copper foil.

DISCLOSURE OF INVENTION

In view of the above circumstances, it is an object of the present invention to provide a technique for stably forming a film having a desired shape of pattern with a superior controllability.

The present invention provides, in a first aspect thereof, a vacuum deposition apparatus for forming a film of a desired shape of pattern on a substrate, including: a carriage member for carrying the substrate; an evaporation source including a substance to be evaporated to form the film; and a blocking member for intermittently blocking movement of the evaporated substance from the evaporation source to the substrate, wherein the blocking member is interposed between the evaporation source and the substrate apart from the substrate.

In accordance with the vacuum deposition apparatus of the first aspect, the blocking member intermittently blocks the movement of the evaporated substance from the evaporation source to the substrate. As a result, a film having a desired shape of pattern can be stably formed with a superior controllability. In the vacuum deposition apparatus of the first aspect, the blocking member disposed apart from the substrate is used instead of the mask used in the conventional technique. This prevents the displacement of the film, and the contamination due to peel off of the evaporated substance, which is attached onto the mask, during the carriage, which are involved in the conventional technique. In addition, the replacement and cleaning of the mask are not needed. Moreover, since it is not necessary to provide a take-up mechanism for the mask, the structure of the apparatus can be simplified.

Further, the blocking member disposed apart from the substrate effectively prevents the problem of the peel-off of the film as encountered in the conventional technique.

Further, although a large tension is needed to the substrate for attaching the mask in close contact therewith in the conventional technique, the blocking member disposed apart from the substrate in the present invention obviates such a large tension. As a result, problems such as cut-off of the substrate during the deposition process can be solved.

In the vacuum deposition apparatus of the first aspect of the present invention, an evaporated substance supply member for guiding the evaporated substance to the substrate may be disposed between the evaporation source and the substrate. In this case, the blocking member may be disposed as a part of the evaporated substance supply member to intermittently block the movement of the evaporated substance from the evaporation source to the substrate. In such a configuration, the blocking member is disposed securely apart from the substrate, thereby preventing the peel-off of a part of the film or cut-off of the substrate during the deposition process.

The evaporated substance supply member may have an opening of a specified shape on the side near the substrate, thereby controlling the amount and area of the supply of the evaporated substance to the substrate based on the shape of the opening. The opening may have preferably a slit-like shape, for example. This is because the supply of the evaporated substance to the substrate can be controlled thereby more accurately, and thus a film having a desired shape of pattern can be formed with a superior controllability.

In the configuration of the vacuum deposition apparatus of the first aspect, a plurality of blocking members may be provided. By this configuration, a laminated film structure including a single material or different materials can be manufactured with a higher throughput. In addition, in the configuration of the vacuum deposition apparatus, a plurality of evaporation sources including different evaporation substances may be provided. By this configuration, a plurality of materials can be evaporated onto the substrate in a continuous process, thereby manufacturing a film having a laminated film structure with a higher throughput.

The present invention provides, in a second aspect thereof, a vacuum deposition apparatus including: a feed roller for feeding therefrom a substrate; a take-up roller for winding the substrate fed by the feed roller; an evaporation source including a substance to be evaporated to deposit on the substrate for vacuum deposition; a screen member having therein a slit opening and disposed between the evaporation source and the substrate; and a shutter mechanism disposed between the screen member and the evaporation source for intermittently blocking movement of the evaporated substance from the evaporation source and the substrate.

In the vacuum deposition apparatus of the second aspect of the present invention, the evaporated substance generated from the evaporation source is guided via the slit opening to the substrate for effecting the deposition process. Since the supply of the evaporated substance is controlled by the slit opening, and the shutter mechanism intermittently blocks the movement of the evaporated substance from the evaporation source to the substrate, a film having a desired shape of pattern can be formed with a superior controllability. In the vacuum deposition apparatus of the second aspect, the shutter mechanism is used instead of the mask used in the conventional technique. The shutter mechanism, as provided apart from the substrate, can prevent the displacement of the film, and the contamination caused by the peel-off of the evaporated substance, attached onto the mask, during the carriage, which are encountered in the conventional technique. In addition, the replacement and cleaning of the mask are not needed. Moreover, since the take-up mechanism for the mask is not needed, the structure of the apparatus is simplified. Further, the problems of peel-off of the film and cut-off of the substrate can be solved.

In the vacuum deposition apparatus of the second aspect, the screen member or the shutter mechanism may include therein a heating member. The heating member may be a heater etc. By this configuration, the evaporated substance attached onto the screen member or shutter member is heated to assume a liquid phase. Thus, the attached, evaporated substance can be collected for reuse thereof.

In the vacuum deposition apparatus of the second aspect, a guide roller may be provided between the feed roller and the take-up roller for allowing the film to be formed accurately on the specified position.

In the vacuum deposition apparatus of the second aspect, a dancer roller may be provided between the feed roller and the take-up roller. By providing the dancer roller, in a single process, another film can be formed accurately on the specified position of the surface other than the surface on which the deposition is first effected, thereby improving the throughput.

In the vacuum deposition apparatus of the second aspect, a position sensor may be provided between the feed roller and the take-up roller for determining the position of the substrate. By providing the position sensor, the position of the substrate on which the deposition is to be effected can be accurately detected. As a result, a higher-accuracy deposition can be obtained.

In the configuration of the vacuum deposition apparatus of the second aspect, the screen member may include a plurality of the slit openings, and the shutter mechanism may be provided corresponding to each of the slit openings. In this configuration, the supply of the evaporated substance through the slit openings is controlled by the shutter mechanism provided for each of the slit openings. The evaporated substance supplied through each of the slit openings allows a laminated film structure including a single material or different materials to be manufactured with a higher throughput.

In the configuration of the vacuum deposition apparatus of the second aspect, a plurality of the evaporation sources including different evaporation substances may be provided. By this configuration, a plurality of materials can be evaporated on the substrate in a continuous process, thereby allowing a film having a multilayer structure to be manufactured with a higher throughput.

The present invention provides, in a third aspect thereof, a vacuum deposition process for forming a film of a desired shape of pattern on a substrate, including the steps of: carrying the substrate in one direction, generating evaporated substance from an evaporation source to guide the evaporated substance to the substrate; and intermittently actuating, during the carriage of the substrate, a blocking member disposed between the substrate and the evaporation source apart from the substrate.

In accordance with the vacuum deposition apparatus of the third aspect of the present invention, the blocking member blocks the movement of the evaporated substance from the evaporation source to the substrate. As a result, a film of a desired shape of pattern is stably formed with a superior controllability. In the present invention, the blocking member disposed apart from the substrate is used instead of the mask used in the conventional technique. This solves the problems of the displacement of the film, the pollution caused by peel-off of the evaporated substance, attached onto the mask, during the carriage, and the cut-off of the substrate during the deposition, which are involved in the conventional technique. In addition, the replacement and cleaning of the masks are unnecessary. Moreover, since the take-up mechanism for the mask is unnecessary, the structure of the apparatus can be simplified.

In the vacuum deposition apparatus of the third aspect, a shutter mechanism, for example, may be used as the blocking member. In addition, a plurality of the blocking members may be provided therein, and after deposition is effected using one of the blocking members, deposition can be subsequently duplicated using another of the blocking members, to thereby form the film. This procedure allows a laminated film structure including a single material or different materials can be manufactured with a higher throughput.

The present invention provides, in a fourth aspect thereof, a vacuum-deposition process for forming an active material film of a desired shape of pattern on a conductive substrate, including the steps of: carrying the conductive substrate in one direction, generating, during the carriage of the conductive substrate, an active material from an evaporation source to guide the active material to the substrate; and intermittently actuating, during the carriage of the substrate, a blocking member disposed between the substrate and the evaporation source apart from the substrate.

In the battery electrode fabrication method of the fourth aspect, the blocking member intermittently blocks movement of the evaporated substance from the evaporation source to the substrate. As a result, an active material film of a desired shape of pattern can be stably formed with higher controllability. In the present invention, the blocking member disposed apart from the substrate is used instead of the mask used in the conventional technique. This solves the problems such as the displacement of the film, the contamination caused by the peel-off of the evaporated substance, attached onto the mask, during the carriage, and the cut-off of the substrate during the deposition, which are involved in the conventional technique. In addition, the replacement and cleaning of the mask are unnecessary. Moreover, since the take-up mechanism for the mask is unnecessary, the structure of the apparatus can be simplified.

In the method for manufacturing the battery electrode of the fourth aspect, a shutter mechanism, for example, may be used as the blocking member. In addition, a plurality of the blocking members may be provided therein, and after the deposition is effected using one of the blocking members, another deposition can be subsequently duplicated using another of the blocking members, to thereby form the film. This procedure allows a laminated film structure including a single material or different materials can be manufactured with a higher throughput.

BEST MODES FOR CARRYING OUT THE INVENTION

Hereinafter, the present invention will be described in more detail based on the embodiments thereof with reference to the accompanying drawings.

Figure 1:
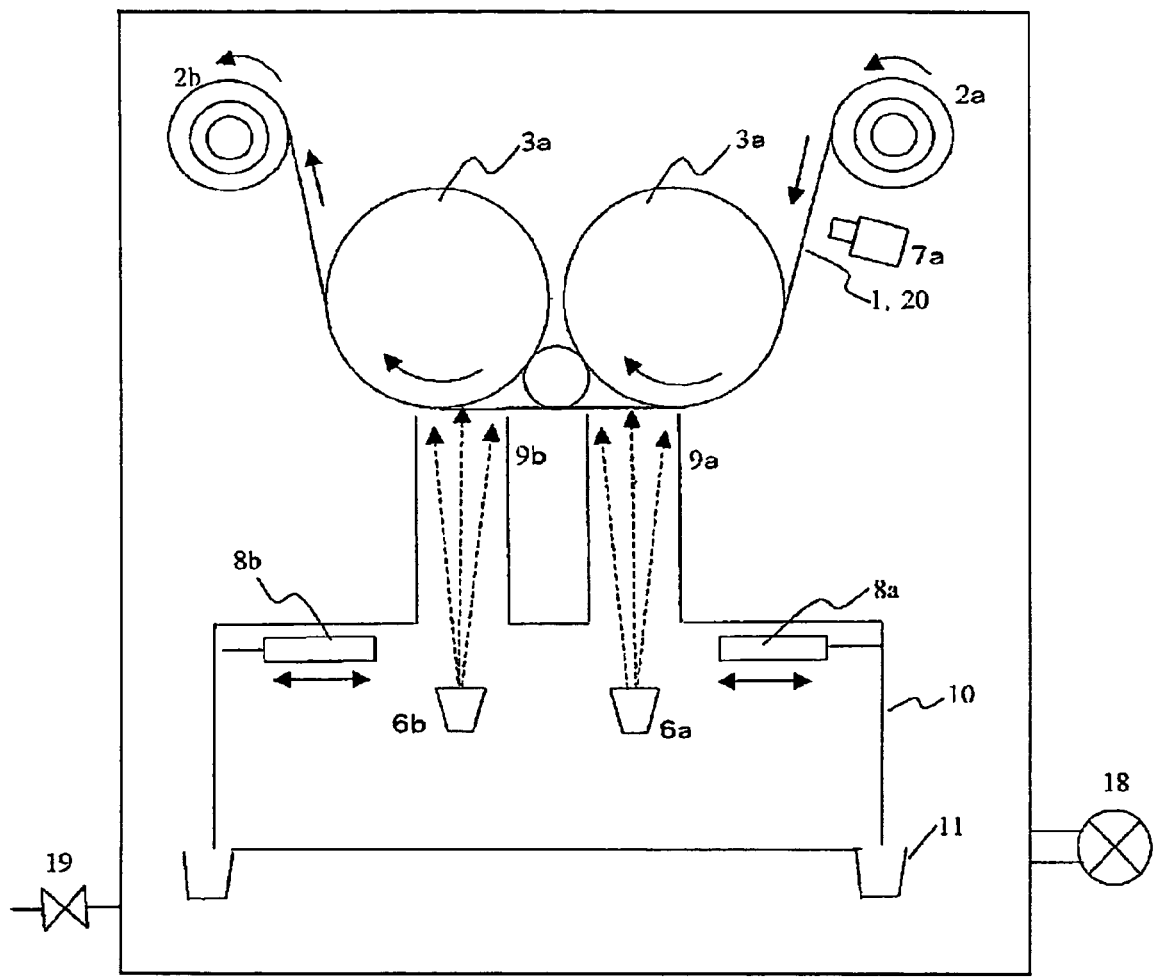
FIG. 1 is a schematic diagram showing the internal configuration of the vacuum deposition apparatus used in a first example.

With reference to FIG. 1, there is shown the configuration of a vacuum deposition apparatus for patterning a film onto the specified position of a flexible substrate. Upon vacuum deposition of the evaporated substance from the evaporation sources 6a and 6b onto the flexible substrate 1, the movement of the evaporated substance via openings of the screen members 9a and 9b is blocked by opening and closing shutters 8a and 8b. This allows a film of a desired shape of pattern to be formed onto the flexible substrate 1.

For the procedures from the feed to the take-up of the flexible substrate 1, there are provided a feed roller 2a for feeding the flexible substrate 1, two guide rollers 3a for moving the flexible substrate 1 with a high accuracy to deposit the evaporated substance from the evaporation sources 6a and 6b onto a desired position of the flexible substrate 1, and a take-up roller 2b for winding up the flexible substrate 1, which is fed from the guide rollers 3a on which the film is patterned. In addition, for accurate deposition on the specified position of the flexible substrate 1, the position of the flexible substrate 1 should be detected using a position sensor 7a before the deposition step.

Figure 2:
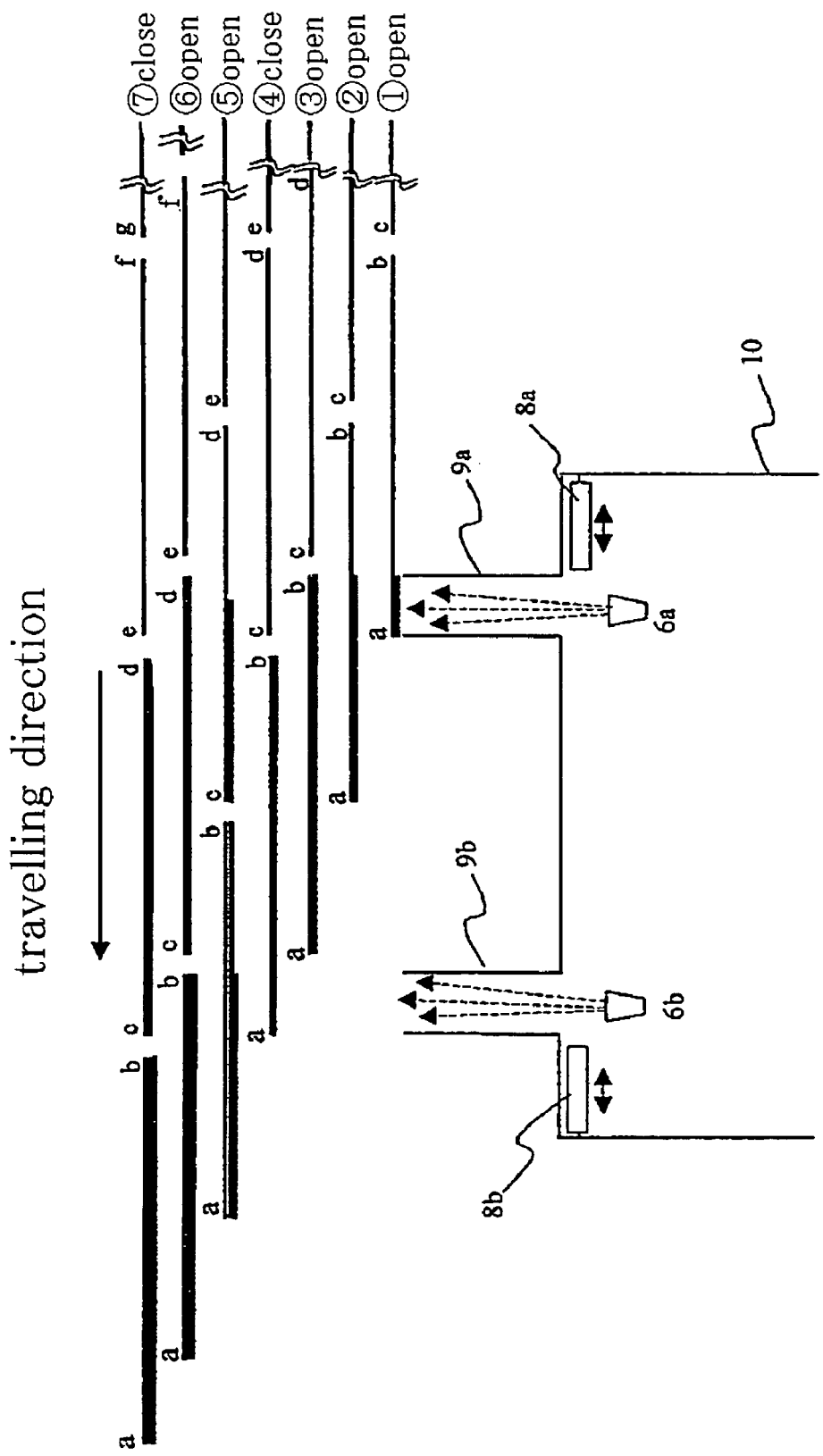
FIG. 2 is a conceptual diagram representing a film patterning step in the present invention.

With reference to FIG. 2, there is shown an explanatory view depicting the principle of the patterning via the guide roller 3a of FIG. 1, and through the screen members 9a and 9b, while opening and closing shutters 8a and 8b. The solid lines (such as line a-b) in the figure represent the section of the flexible substrate on which the film is formed (the lengths for forming the films are all equal). In addition, the portion corresponding to a blank of the solid line (such as between "b" and "c") represents a portion (space) on which no film is formed (the lengths of the spaces are all equal). The length between "b" and "c" is referred to herein as a pitch.

In the present embodiment, as an example, a desired thickness for the deposition is designed to obtain by using the two evaporation sources 6a and 6b (twice evaporations). The pitch of the two screen members (9a and 9b) above the evaporation sources 6a and 6b is equal to the length of the flexible substrate 1 on which the film is formed (for example, line a-b). The top of the screen members 9a and 9b is open and corresponds to the area through which the evaporated substance passes. For achieving a higher accuracy of the patterning, it is preferable that the distance between the blocking member 9a and the flexible substrate 1 be short, and be effectively selected equal to or below several millimeters, for example. When the flexible substrate 1 is in the state of ①, where the point "a" is aligned with the leftmost end of the opening of the screen member, the first shutter 8a becomes open. Here, it is possible to accurately open and close the shutter so long as the relationship between the detection of the point "a" of the flexible substrate 1 by using the position sensor 7a and the travelling speed of the flexible substrate 1. Since the flexible substrate 1 moves in the direction of arrow at a controlled velocity, the evaporated substance is consecutively filmed on the "a-b" of the substrate through the opening of the screen member, as shown in the state of ②. In the state of ③, when the point "b" reaches the rightmost end of the screen member, the first shutter 8a is closed. Subsequently, in the state of ④, when the point "c" moves to the leftmost end of the opening of the screen member, the first shutter 8a is opened. At this stage, the second shutter 8b is opened simultaneously, whereby a second deposition is effected between "a" and "b" together with a first deposition effected between "c" and "d". Further, in the state of ⑥, when the points "b" and "d" move to the rightmost ends of the openings of the respective screen members (9a and 9b), deposition of a desired thickness on the "a-b" is completed. By closing the two shutters (8a and 8b), and by opening the two shutters (8a and 8b) when the points "c" and "e" move to the rightmost ends of the openings of the screen members, deposition on the "c-d" (second deposition) and on the "e-f" (first deposition) is effected.

By iterating the above procedures, an accurate mask-less patterning can be achieved on the flexible substrate 1. By using a heater to control the screen members (9a and 9b), an attach-prevention plate 10 in the chamber, shutters (8a and 8b) etc. at desired temperatures, the attached substance can be melted to be collected in a collection container 11.

Figure 3:
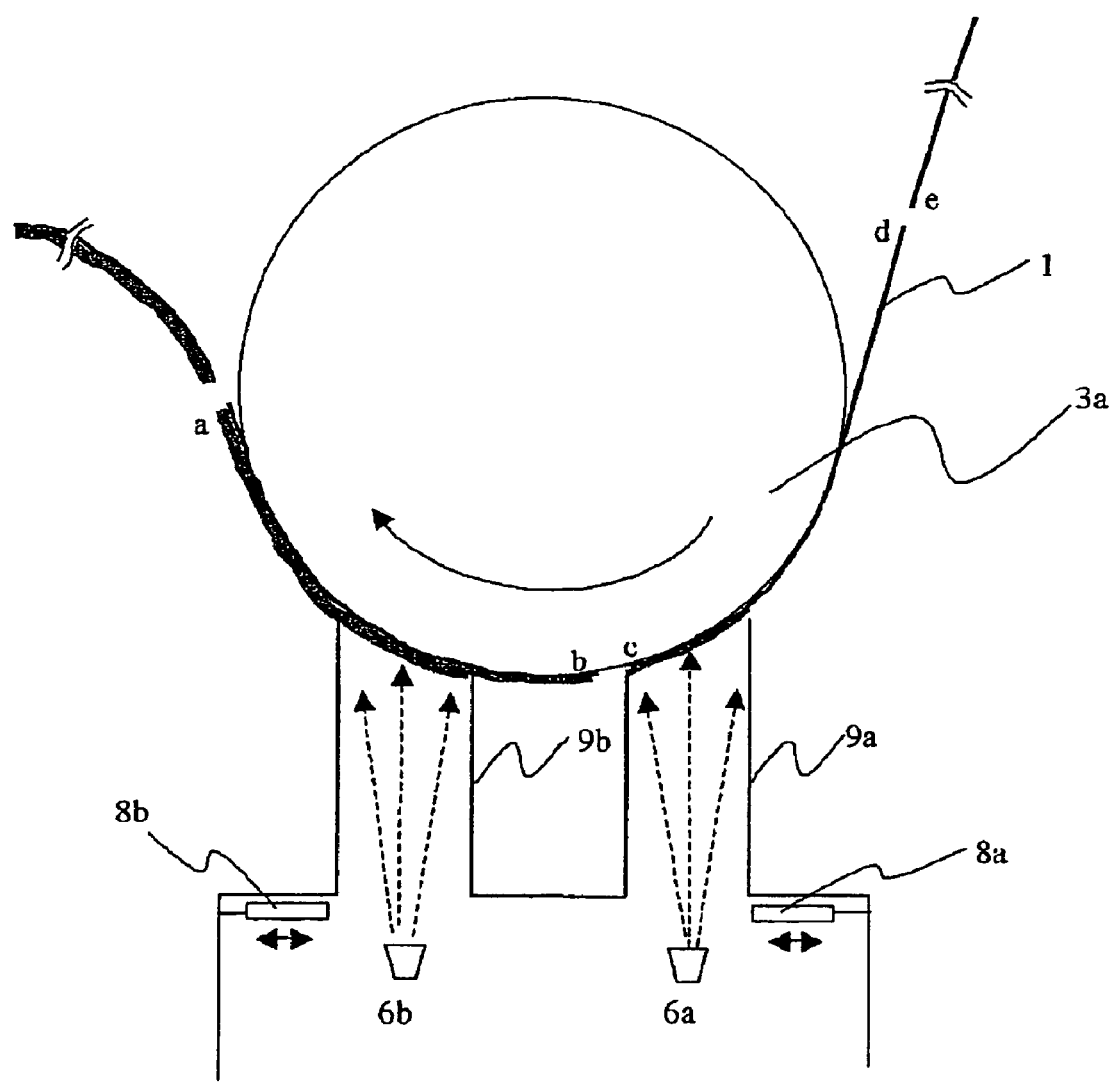
FIG. 3 is a schematic diagram showing the internal configuration of the vacuum deposition apparatus for effecting the film patterning via the curved surface of a guide roller.

Although, in the above embodiment, two guide rollers 3a are used to extend the flexible substrate 1 in a line (or in a plane) for deposition thereon during the vacuum deposition on the flexible substrate 1, the present invention is not limited thereto. For example, as shown in FIG. 3, the flexible substrate 1 may be moved together with the guide rollers 3a along the curved surface of the guide rollers 3a, and disposing the screen members (9a and 9b) having different lengths of the screen plates underlying the specified position of the guide rollers 3a, a similar patterning process can be achieved.

Although, in the above embodiment, a shutter mechanism is exemplarily provided as a mechanism for intermittently blocking the movement of the evaporated substance, the mechanism is not limited to the shutter mechanism and another mechanism may be used for carrying out the present invention. For example, by employing a mechanism for intermittently stopping the heating of the evaporation source, the movement of the evaporated substance may be intermittently blocked.

In addition, a single opening may be used for achieving a similar patterning, although the two slit openings are exemplarily provided in the above embodiment.

By providing two or more slit openings, the time length for achieving a desired film thickness can be reduced, the travelling speed of the flexible substrate can be reduced not to break the flexible substrate, and the evaporation rate in each of the evaporation sources can be reduced to thereby reduce the radiation heat from the evaporation sources. As a result, additional advantages can be also obtained such as suppression of the adverse affects on the substrate or the films formed in advance on the substrate.

For depositing two or more different films, two or more slit openings are provided, and two or more different evaporated substances are supplied from evaporation sources provided for each of the slit openings. This allows a laminated film to be formed in a single step, thereby achieving improvement of the throughput. In addition, when two different films are desired to form in a conventional mask technique, there is a possibility that the evaporated substance attached onto the mask my be mixed in another evaporation source for another evaporated substance during the deposition procedure for the another evaporated substance. Since no mask is used in the present invention, the present invention has an advantage of absence of this problem.

The shape of the screen member may be selected such as including a planar opening other than the projected shape such as shown in FIG. 1.

The flexible substrate is exemplarily used as the substrate in the above embodiment, the substrate in the present invention is not limited to the flexible substrate, and glass plate, metallic plate, plastic plate etc. may be used. Although the apparatus including a feed mechanism and a take-up mechanism is exemplified in the embodiment of the present invention, the feed mechanism and take-up mechanism are not necessarily provided therein, and other members such as a belt conveyer may be used for carrying out the present invention.

The vacuum deposition apparatus and the deposition process as described above may be used in part of fabrication system or fabrication process for manufacturing batteries, secondary batteries, a variety of packing films, a variety of sealing films, coating glasses, magnetic recording disks, organic electroluminescent devices, inorganic film electroluminescent devices, film capacitors etc.

FIRST EXAMPLE

In the first example, a process for patterning a film made of silicon-lithium alloy (SiLi) on a patterned graphite as an anode of a non-aqueous electrolyte secondary battery by using the vacuum deposition apparatus of FIG. 1 is exemplified, wherein the surfaces of an anode collector (copper film) were patterned one by one. It is to be noted that evaporation sources (6a to td) each including the silicon-lithium alloy (SiLi) were used in the following examples and the comparative examples.

Figure 4:
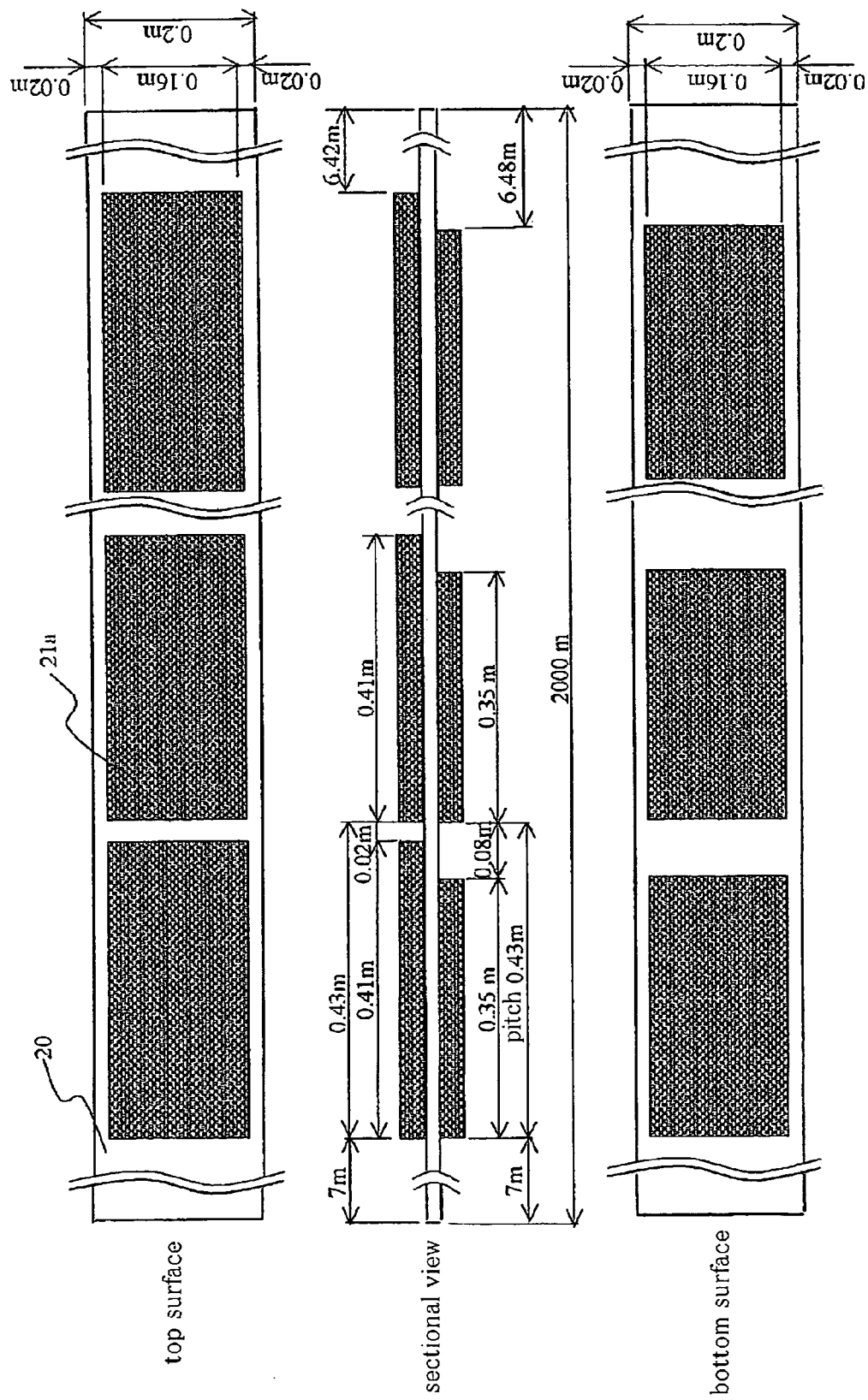
FIG. 4 is a schematic diagram of a copper foil wherein graphite is patterned by coating used in first and second examples as well as first and second comparative examples.

As shown in FIG. 4, a copper foil 20 having a length of about 2000 meters and a thickness of 10 μm was used as a flexible substrate constituting an anode collector, on which a layer 21a made of graphite was deposited. This graphite layer 21a was obtained by admixing polyvinylidene fluoride, wherein graphite powder was dissolved in N-methyl-2-pyrrolidone as a binder, and a conductivity-affording agent to obtain a paste, coating the resultant paste on both surfaces of the copper foil 20 and drying the coated paste. After the drying, the copper foil 20 coated with graphite was wound up while compressing the same. The graphite layer 21a was 70 μm thick. As shown in FIG. 4, the copper foil 20 had a 7-m-long uncoated portion at the leftmost end, and a 6.42-m-long uncoated portion at the rightmost end on the top surface thereof. The graphite layer 21a is formed at a pitch of 0.43 m from the position 7 m apart from the leftmost end (coated portion: 0.41 m, and space: 0.02 m), whereby 4620 coated portions are provided. On the other hand, there are a 7-m-long uncoated portion at the leftmost end and a 6.48-m-long uncoated portion on the bottom surface. The graphite-coated portions are arranged at a pitch of 0.43 m from the position 7 m apart from the leftmost end (coated portion: 0.35 m, and space: 0.08 m), whereby 462 coated portions are provided.

For patterning the top side of the copper foil 20, the configuration was such that the pitch of the screen members 9a and 9b of FIG. 1 was 0.43 m, and the slit (opening) was 5 cm wide in the travelling direction of the copper foil and 0.16 m wide in the direction normal to the travelling direction.

On the graphite layer 21a thus patterned, a (3-μm-thick) SiLi layer was formed by pattern-deposition using a vacuum evaporation process. As an initial state of arrangement of the copper foil 20, the copper foil 20 formed in advance was attached onto the feed roller 2a of the vacuum evaporation apparatus of FIG. 1, the copper foil 20 was moved along the guide roller 3a simultaneously, the front end of the copper foil 20 was attached onto the take-up roller 2a, the copper foil 20 was applied with a suitable tension by driving the whole or some of the rollers, and the copper foil 20 was arranged in a planar state above the evaporation sources 6a and 6b without slack or bending. The gap between the screen members 9a and 9b and the copper foil 20 was 0.5 mm. The distance between the evaporation sources (6a and 6b) and the copper foil 20 was 25 cm.

A vacuum exhaust device 18 was operated to evacuate the vacuum chamber down to a degree of vacuum at $1\times10^{-4}$ Pa, followed by effecting a deposition process.

While driving all the rollers, the copper foil 20 was carried at an arbitrary velocity. The accurate deposition of the (3-μm-thick) SiLi alloy layer 21b onto the graphite layer 21a on the top side of the copper foil 20 was effected during the carriage of the copper foil 20 by controlling the travelling speed while detecting the end of the graphite layer 21a on the top surface of the copper foil 20 with the position sensor 7a, and by using the technique for opening and closing the shutters (8a and 8b) as described before. After the deposition, Ar gas was introduced into the chamber by using a gas-inlet valve 19, followed by opening the chamber and extracting therefrom the copper foil 20 wound up by the take-up roller 2b.

Subsequently, the copper foil 20 thus extracted is patterned on the bottom side. For patterning on the bottom side of the copper foil 20, the configuration was such that the pitch of the screen members (9c and 9d) was 0.43 m, the slit (opening) was 5 cm wide in the travelling direction of the copper foil and 0.16 m wide in the direction normal to the travelling direction.

The vacuum exhaust device was operated to evacuate the vacuum chamber down to a degree of vacuum at $1\times10^{-4}$ Pa, followed by effecting a deposition process.

The accurate deposition of a (3-μm-thick) SiLi alloy layer 21b onto the graphite layer 21a on the bottom side of the copper foil 20 was effected during the carriage of the copper foil 20 by controlling the travelling speed while detecting the end of the graphite layer 21a on the bottom surface of the copper foil 20 with the position sensor 7b, and by using the technique for opening and closing the shutters (8a and 8b) as described before, wherein the (3-μm-thick) SiLi layer 21b was pattern-deposited on the graphite layer 21a and the copper foil 20 were wound up by using the take-up roller 2b. After the deposition, Ar gas was introduced into the chamber by using a gas-inlet valve 19, followed by opening the chamber and extracting therefrom the copper foil 20 wound up by the take-up roller 2b.

Figure 5:
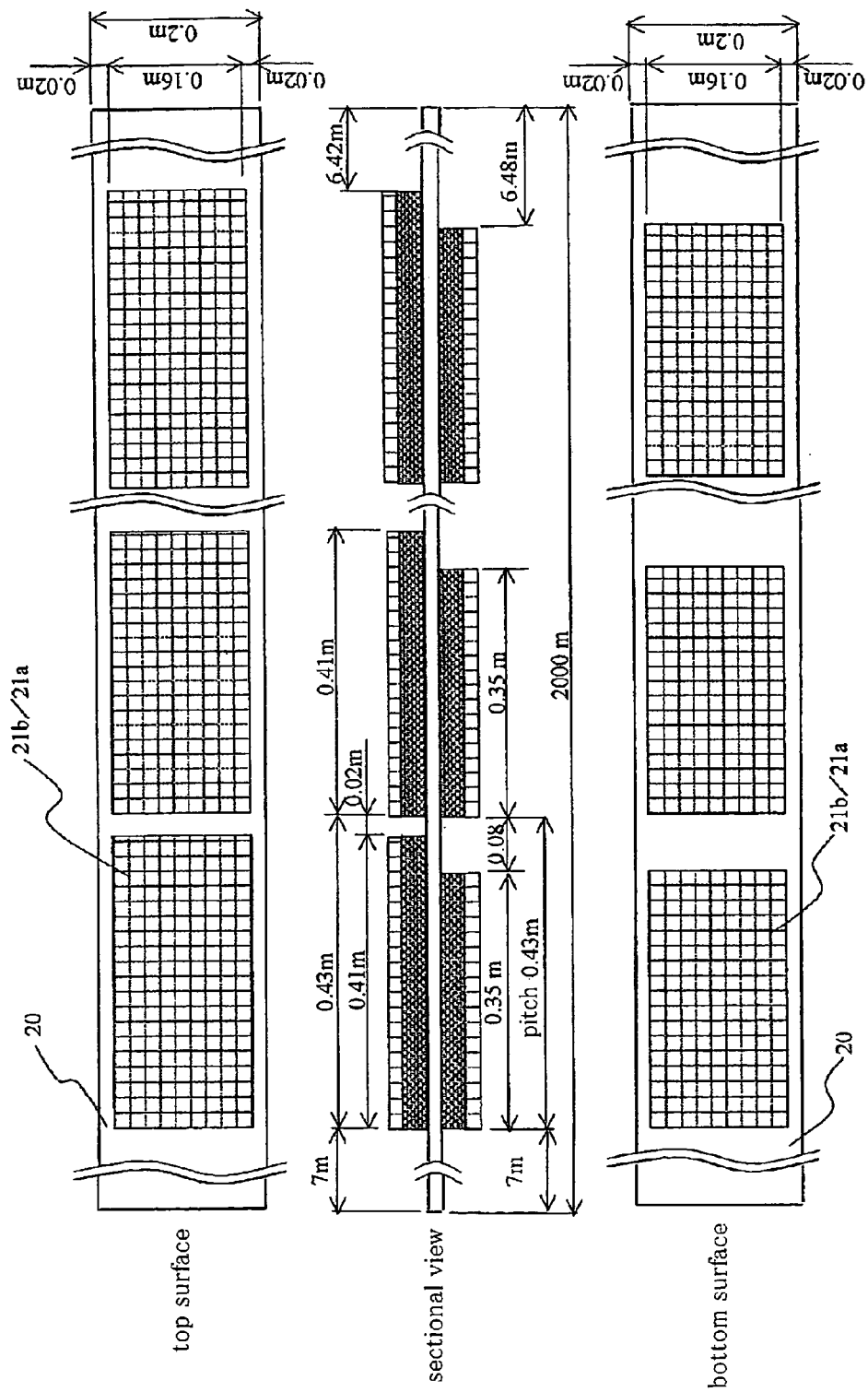
FIG. 5 is a schematic diagram of an anode wherein SiLi is patterned by evaporation onto the graphite obtained in the first and second examples.

FIG. 5 shows the anode pattern on the copper foil 20 manufactured in the manner as described above. It was confirmed that the top side of the copper foil 20 had a 7-m-long uncoated portion at the leftmost end, and a 6.42-m-long uncoated portion at the rightmost end, as exactly as designed. It was confirmed that the (3-μm-thick) SiLi layer 21b was accurately formed on the graphite layer 21a at a pitch of 0.43 m from the position 7 m apart from the leftmost end (coated portion: 0.41 m, and space: 0.02 m), and all (4620) of the anode patters were obtained. On the other hand, it was confirmed that the bottom side had a 7-m-long uncoated portion at the leftmost end, and a 6.48-m-long uncoated portion at the rightmost end. It was confirmed that the (3-μm-thick) SiLi layer 21b was accurately formed on the graphite layer 21a at a pitch of 0.43 m from the position 7 m apart from the leftmost end (coated portion: 0.35 m, and space: 0.08 m), and all (4620) of the anode patterns were achieved.

FIRST COMPARATIVE EXAMPLE

In the first comparative example, a pattern mask and a copper foil are overlapped and carried in synchrony with each other, to try electrode patterning on the copper foil through the opening of the pattern mask.

The copper foil 20 on which graphite was formed is similar to that used in the first example. It is to be noted that alignment marks (holes) 22 are appropriately provided therein for alignment with the pattern mask. A Ni-plated copper foil 24, obtained by forming openings 22 in a copper foil, which was about 20 μm thick, 0.24 m wide and about 2000 m long, and plating the surface of the copper foil with nickel, was used as the pattern mask. FIG. 6(a) shows the pattern of the graphite layer on the top surface of the copper foil, whereas FIG. 6(b) schematically shows the pattern mask for patterning on the top side of the copper foil. The pattern mask is also provided with alignment marks 22 for alignment with the copper foil 20. FIG. 7(a) shows the graphite layer on the bottom surface of the copper foil 20, whereas FIG. 7(b) schematically shows the pattern mask for patterning on the bottom side of the copper foil 20. The pattern mask is also provided with alignment marks 22 for alignment with the copper foil 20.

Figure 8:
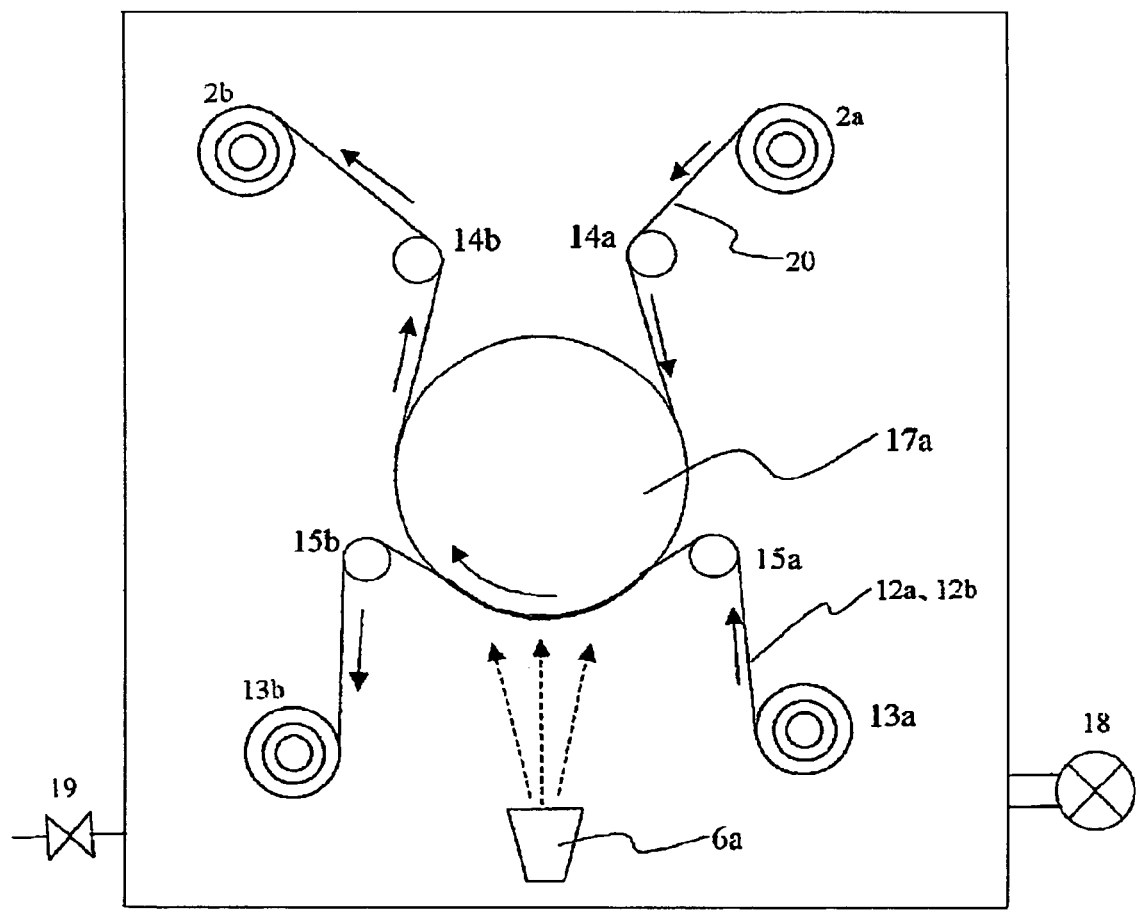
FIG. 8 is a schematic diagram showing part of the internal configuration of the vacuum deposition apparatus used in the first comparative example.

With reference to FIG. 8, there is shown the internal configuration of the vacuum deposition apparatus used in the first comparative example. It basically consists of a carriage mechanism for the copper foil 20 and a carriage mechanism for carrying the mask in synchrony with the copper foil. The rollers for procedures from the feed to the take-up of the copper foil 20 include a feed roller 2a for feeding the copper foil 20, a guide roller 14a provided for guiding the copper foil 20 toward a can roller 17a, the can roller 17a for effecting the close attachment between the copper foil 20 and the pattern mask 12a or 12b, and improvement of the accuracy of the deposition effected in synchrony, a guide roller 14b for accurately carrying the copper foil 20 fed from the can roller 17a toward a take-up roller, and the take-up roller 2b for winding up the copper foil 20 fed from the guide roller 14b. The rollers for procedures from the feed to the take-up of the pattern mask 12a or 12b include a feed roller 13a for feeding the pattern mask, a guide roller 15a provided for guiding the pattern mask 12a or 12b toward the can roller 17a, a take-up roller 13b for winding up the pattern mask 12a or 12b fed from the guide roller 15a. The distance between the evaporation source 6a and the bottom of the can roller 17a was set at 25 cm.

First, on the graphite layer 21a patterned on the top side of the copper foil, a (3-μm-thick) SiLi layer 21b was pattern-deposited using a vacuum evaporation process. As an initial state of arrangement of the copper foil 20, the wound core of the copper foil 20 formed in advance was attached onto the feed roller 2a shown in FIG. 8, and the pattern mask 12a (for the top side, shown in FIG. 6(b)) formed in advance was attached onto the pattern mask feed roller 13a. The copper foil 20 and the pattern mask 12a were moved along the can roller 17a while aligning the alignment marks 22 together to attain a close contact with each other, thereby attaching the front ends of the copper foils 20 and the pattern mask 12a onto the rollers 2b and 13b, respectively, by using the guide rollers 14b and 15b. All or some of the rollers were then driven to apply the copper foil 20 and the pattern mask 12 with a suitable tension, thereby allowing the copper foil 20 and the pattern mask to be in close contact with the can roller 17a above the evaporation source 6a, without involving any slack or bending.

By driving all the rollers, the copper foil 20 and the pattern mask 12a are carried at an arbitrary speed in synchrony with each other, and SiLi is continuously evaporated from the evaporation source without using a shutter mechanism. After effecting deposition for 1200 m, the pattern mask 12a was cut-off. After the deposition, Ar gas was introduced using the gas inlet valve into the chamber, followed by opening the chamber and extracting therefrom the copper foil 20 wound on the take-up roller 2b. Observation of the pattern of the successful portion on the copper foil 20 proved absence of the SiLi layer on a portion of the graphite, and presence of the SiLi layer on a region other than the graphite. This is because misalignment occurred between the copper foil 20 and the pattern mask 12a during the carriage. In addition, a scratch or peel-off was observed in a portion of the surface of the layer on the copper foil 20. This is because the layer is scratched upon occurring of the misalignment during the carriage of the copper foil 20 and the pattern mask 12a in close contact with each other.

Subsequently, an active material made of SiLi is pattern-deposited using a vacuum evaporation process onto the patterned graphite layer 21a on the bottom side of the copper foil. As an initial state of arrangement of the copper foil 20, the wound core of the copper foil 20 formed in advance was attached onto the feed roller 2a shown in FIG. 8, and the pattern mask 12a (for the bottom side, shown in FIG. 7(a)) formed in advance was attached onto the pattern mask feed roller 13a. The copper foil 20 and the pattern mask 12a were moved along the can roller 17a while aligning the alignment marks 22 together to attain a close contact with each other, thereby attaching the front ends of the copper foils 20 and the pattern mask 12a onto the rollers 2b and 13b, respectively, by using the guide rollers 14b and 15b. All or some of the rollers were then driven to apply the copper foil 20 and the pattern mask 12 with a suitable tension, thereby allowing the copper foil 20 and the pattern mask to be in close contact with the can roller 17a above the evaporation source 6a, without involving any slack or bending.

The vacuum exhaust device 18 was operated to evacuate the vacuum chamber down to a degree of vacuum at $1\times10^{-4}$ Pa, followed by effecting a deposition process.

By driving all of the rollers, the copper foil 20 and the pattern mask 12a were moved in synchrony with each other at an arbitrary velocity, and SiLi was continuously evaporated from the evaporation source without using a shutter mechanism. After effecting deposition for about 500 m, the pattern mask was cut-off. After the deposition, Ar gas was introduced using the gas inlet valve 19 into the chamber, followed by opening the chamber and extracting therefrom the copper foil 20 wound on the take-up roller 2b. Observation of the pattern on the successful portion of the copper foil 20 proved absence of the SiLi layer on a portion of the graphite, and presence of the SiLi layer on the area other than the graphite. This is because misalignment occurred between the copper foil 20 and the pattern mask 12a during the carriage. In addition, a scratch or peel-off was observed in a portion of the surface of the layer on the copper foil 20. This is because the layer is scratched upon occurring of the misalignment during the carriage of the copper foil 20 and the pattern mask 12a in close contact with each other.

As described above, in the conventional deposition process synchronizing (carrying) the pattern mask and the copper foil with each other, an electrode pattern for the secondary battery was not successfully manufactured.

The conventional deposition process synchronizing (carrying) the pattern mask and the copper foil with each other must include, in addition to a carriage member for the substrate, a carriage member for the pattern mask in the vacuum deposition apparatus, and thus is complicated in the structure thereof. On the other hand, the vacuum deposition apparatus of the first example does not use the pattern mask, and thus need not include the carriage member for the pattern mask, thereby simplifying the structure of the apparatus.

In addition, in the conventional deposition process synchronizing (carrying) the pattern mask and the copper foil with each other, control for both the carriage of the substrate and the pattern mask is needed. Moreover, the position of the pattern mask with respect to the position of the substrate must be detected. This causes a difficulty in the deposition of the film accurately at a desired position. On the other hand, in the vacuum deposition apparatus of the first example, the screen member is fixed, and alone the substrate is a transferred constituent element. In addition, the position of the substrate on which the deposition is to be effected is detected by the position sensor, and the shutter mechanism is controlled based on the information thereof. As a result, deposition can be accurately effected on the substrate.

SECOND EXAMPLE

In the second example, a vacuum deposition apparatus for patterning a film made of silicon-lithium alloy (SiLi) on a patterned graphite as an anode of a non-aqueous electrolyte secondary battery by using a vacuum throughout the process, wherein both the surfaces of an anode collector (copper film) were patterned, and a method for using the apparatus will be described.

Figure 9:
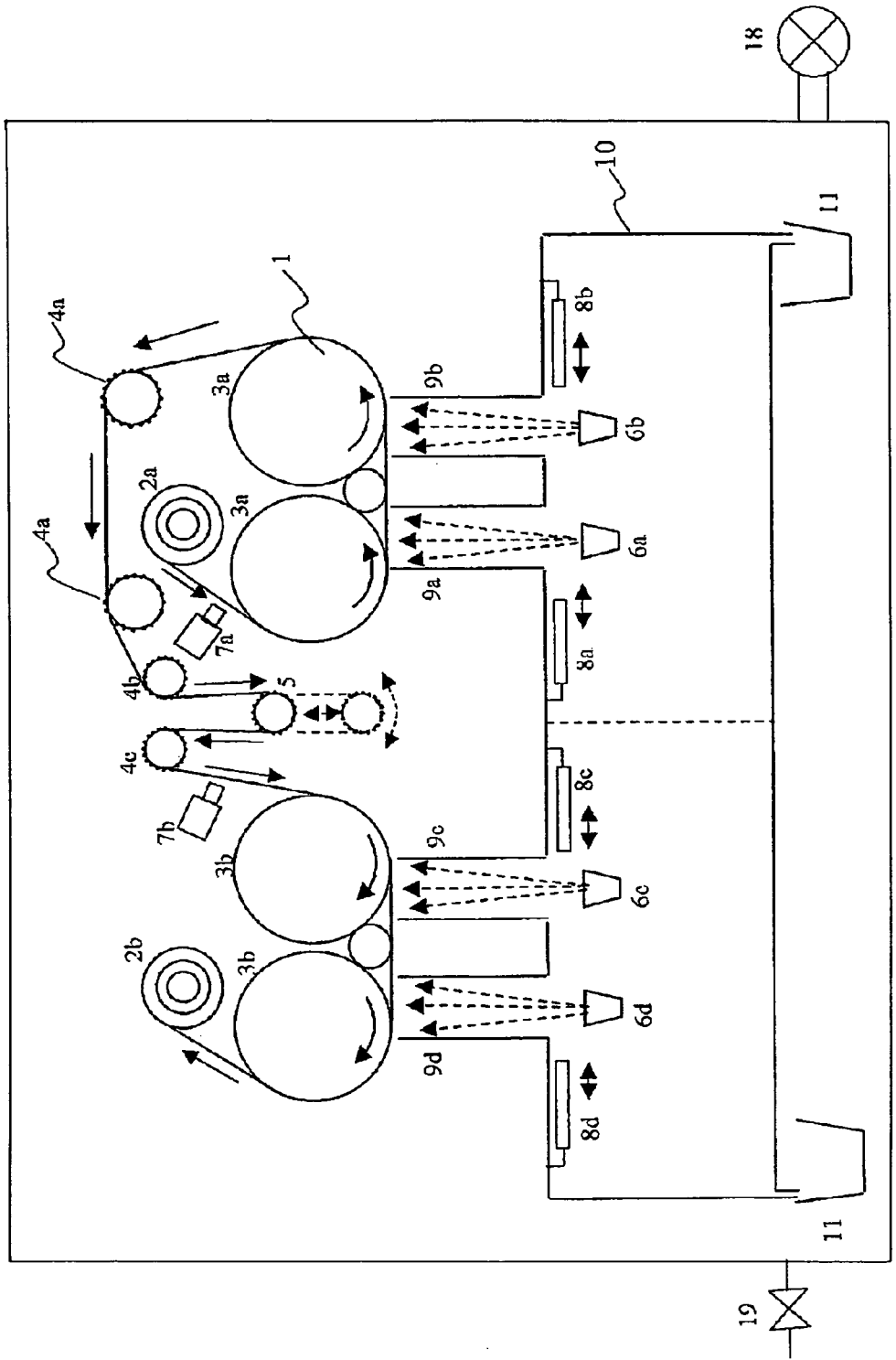
FIG. 9 is a schematic diagram showing part of the internal configuration of the vacuum deposition apparatus used in the second example.

The copper foil attached with graphite was similar to that used in the first example. FIG. 9 schematically shows the internal configuration of the vacuum evaporation apparatus for forming a SiLi layer 21b on the specified positions (graphite layers 21a) of both the top and bottom surfaces of the copper foil 20 shown in FIG. 4. The rollers for procedures from the feed to the take-up of the copper foil 20 include a feed roller 2a for feeding the copper foil 20, two guide rollers 3a provided for accurately moving the copper foil 20 to accurately deposit evaporated substance from the evaporation sources (6a and 6b) on the top surface of the copper foil 20, two guide rollers 4a provided for accurately moving the copper foil 20 fed from the guide rollers 3a to direct the bottom surface of the copper foil 20 toward the evaporation sources 6c and 6d, a dancer roller 5 capable of changing the speed of the copper foil 20 fed from the guide rollers 4a and provided for deposition on the specified position of the bottom surface, a guide roller 4b having a role for transferring the copper foil 20 to the dancer roller 5, a guide roller 4c for accurately transferring the copper foil 20 fed from the dancer roller 5 to guide rollers 3b, two guide rollers 3b provided for deposition on the specified position of the bottom surface of the copper foil 20 fed from the dancer roller 5, and a take-up roller 2b for winding the copper foil 20 fed from the guide rollers 3b and having both surfaces on which silicon films are patterned.

In addition, position sensors 7a and 7b are provided for the step prior to the deposition, for accurately detecting the position of the graphite layer 21a on the copper foil 20, and for accurate deposition onto the graphite by using light reflectances of the copper foil surface and the graphite-coated surface. The pitch of the screen members 9a and 9b for patterning the top side of the copper foil 20 was 0.43 m, and the silt (opening) was 5 cm wide in the travelling direction, and 0.16 m wide in the direction normal to the travelling direction. On the other hand, the pitch of the screen members 9c and 9d for patterning on the bottom side of the copper foil 20 was 0.43 m, and the slit (opening) was 5 cm wide, and 0.16 m wide in the direction normal to the travelling direction.

On the patterned graphite layer 21a, a (3-μm-thick) SiLi layer 21b was pattern-deposited using a vacuum evaporation process. As an initial state of arrangement of the copper foil 20, the wound core of the copper foil 20 prepared in advance is attached onto the feed roller 2a of the vacuum deposition apparatus, and at the same time, copper foil 20 is moved along the guide roller 3a→guide roller 4a→guide roller 4b→dancer roller 5→guide roller 4c→guide roller 3b, thereby attaching the front end of the copper foil 20 to the take-up roller 2b, driving all or some of the rollers to apply the copper foil 20 with a suitable tension, and arranging the copper foil 20 in a planar state above the evaporation source without any slack or bending. The gap between the screen members 9a, 9b, 9c and 9d and the copper foil 20 was 0.5 mm. The distance between the evaporation sources 6a, 6b, 6c and 6d and the copper foil 20 was 25 cm.

The vacuum exhaust device was then operated to evacuate the vacuum chamber down to a degree of vacuum at $1 \times 10^{-4}$ Pa, followed by effecting deposition.

By driving all the rollers, the copper foil 20 was carried at an arbitrary speed. An accurate deposition of a (3-μm-thick) SiLi layer onto the graphite layer 21a on the top side of the copper foil 20 was effected by detecting the end of the graphite layer 21a on the top side of the copper foil 20 during the carriage of the copper foil 20 with the position sensor 7a to control the travelling speed, and by the deposition process opening and closing the shutters 8a and 8b as described before. The accurate deposition of the SiLi layer 21b on the graphite layer 21a on the bottom side of the copper foil 20 was effected by detecting the end of the graphite layer 21a with the position sensor 7b to control the travelling speed, and the deposition process opening and closing the shutters 8c and 8d as described before, thereby pattern-depositing the SiLi layer 21b on the graphite layer 21a, followed by winding the copper foil 20 onto the take-up roller 2b. After the deposition, Ar gas was introduced via the gas inlet valve into the chamber, followed by opening the chamber and extracting therefrom the copper foil 20 wound on the take-up roller 2b.

Figure 6:
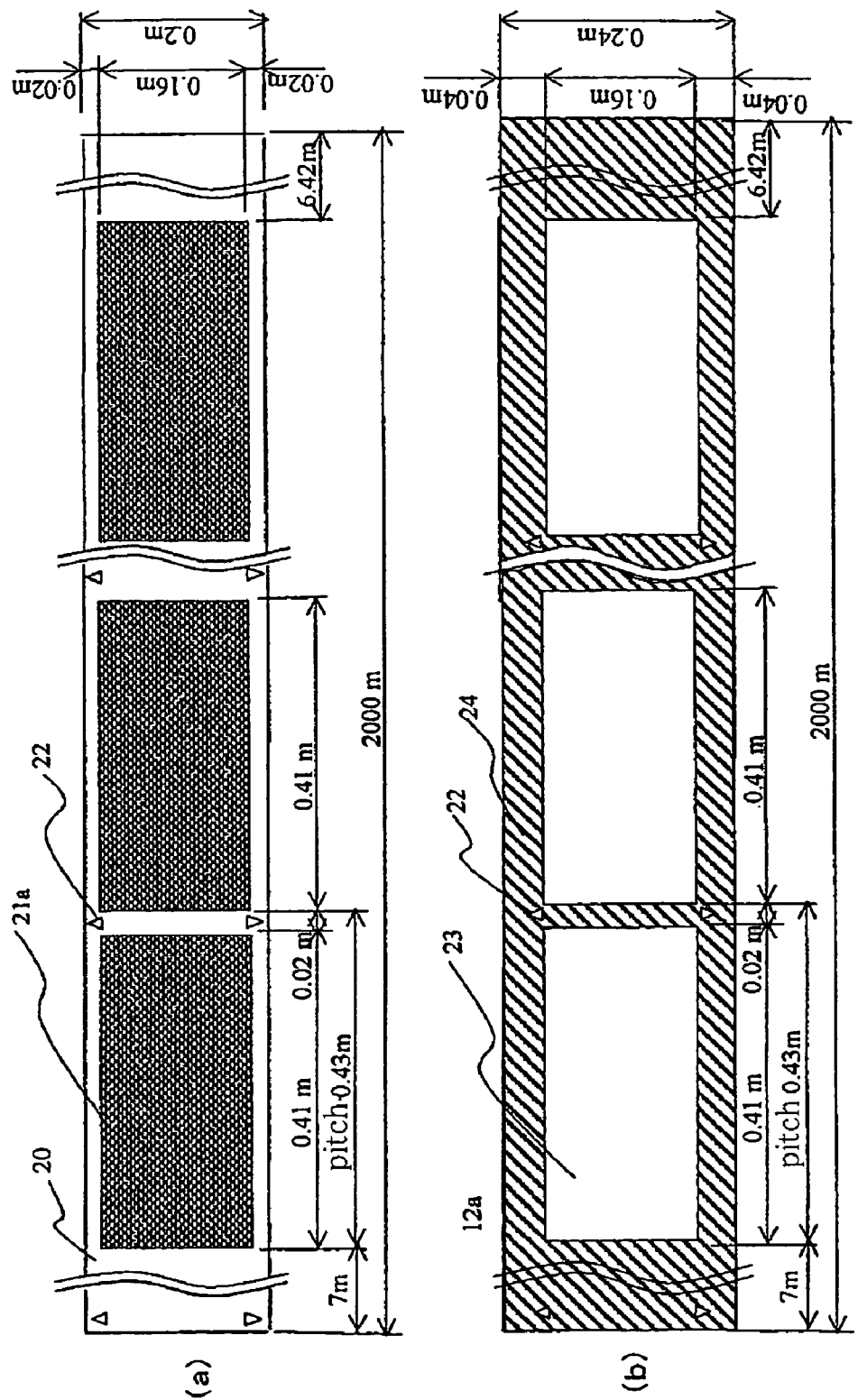
FIG. 6 is a schematic diagram of the pattern mask corresponding to the top surface of the copper foil used in the first and second comparative examples.
Figure 7:
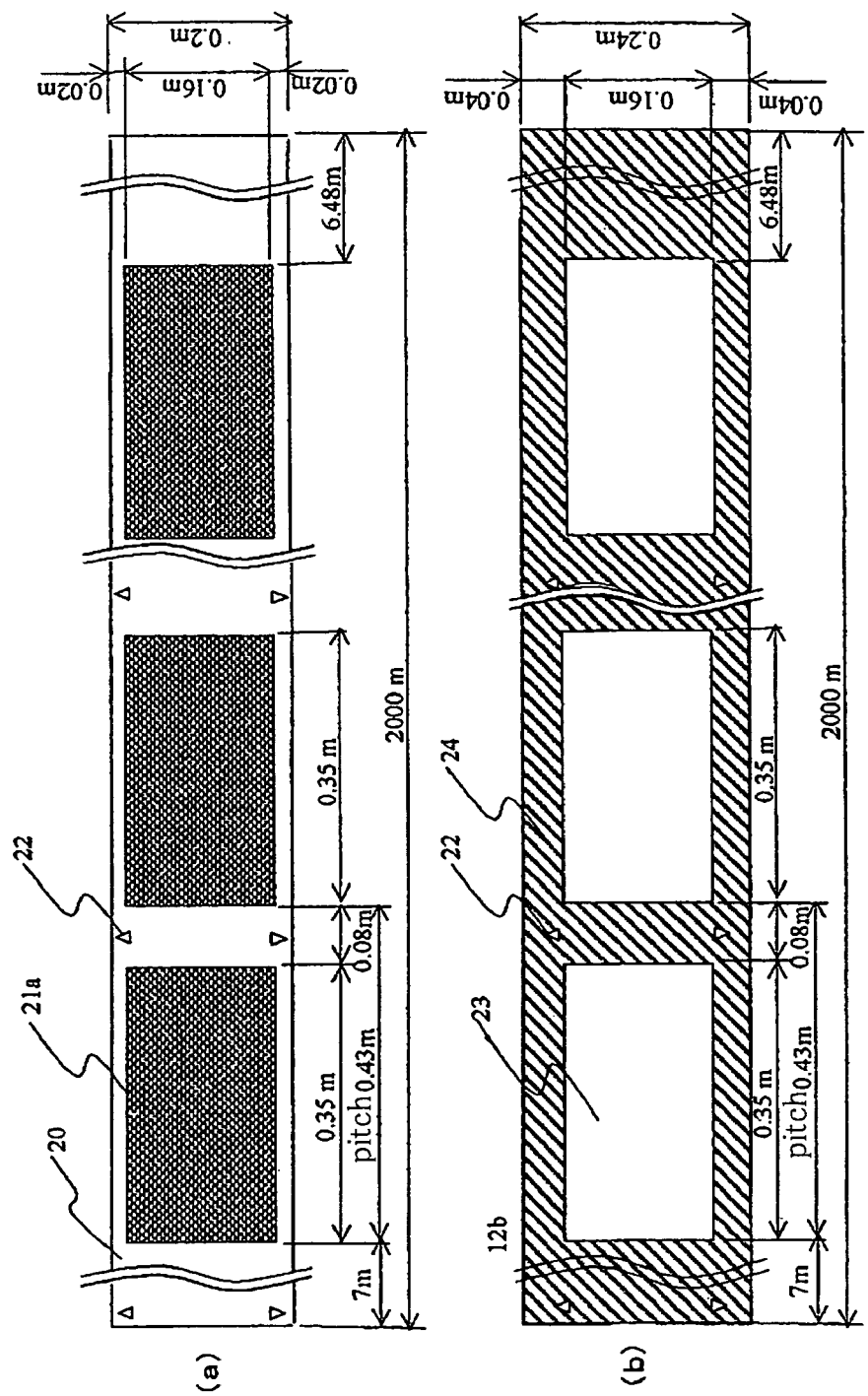
FIG. 7 is a schematic diagram of the pattern mask corresponding to the bottom surface of the copper foil used in the first and second comparative examples.

FIG. 6 shows the state of the anode pattern on the copper foil manufactured in the manner described above. It was confirmed that there were a 7-m-long non-evaporated portion at the leftmost end, and a 6.42-m-long non-evaporated portion at the rightmost end on the top side of the copper foil. The (3-μm) SiLi layer 21b was formed accurately on the graphite layer 21a from the position 7 m apart from the leftmost end at a pitch of 0.43 m (coated portion: 0.41 m, and space: 0.02 m), and presence of an anode was confirmed wherein 4620 SiLi layers 21b were formed. On the other hand, it was confirmed that there were a 7-m-long non-evaporated portion at the leftmost end, and a 6.42-m-long non-evaporated portion at the rightmost end on the bottom side. The SiLi layer 21b was formed accurately on the graphite layer 21a from the position 7 m apart from the leftmost end at a pitch of 0.43 m (coated portion: 0.35 m, and space: 0.08 m), and presence of an anode was confirmed wherein 4620 SiLi layers 21b were formed.

SECOND COMPARATIVE EXAMPLE

In the second comparative example, it was tried to carry the pattern mask shown in the first comparative example and the copper foil in synchrony with each other for patterning anodes on both sides of the copper foil in a vacuum throughout the process. The copper foil on which graphite was formed and the mask pattern, which were used in the first comparative example, were used herein.

Figure 10:
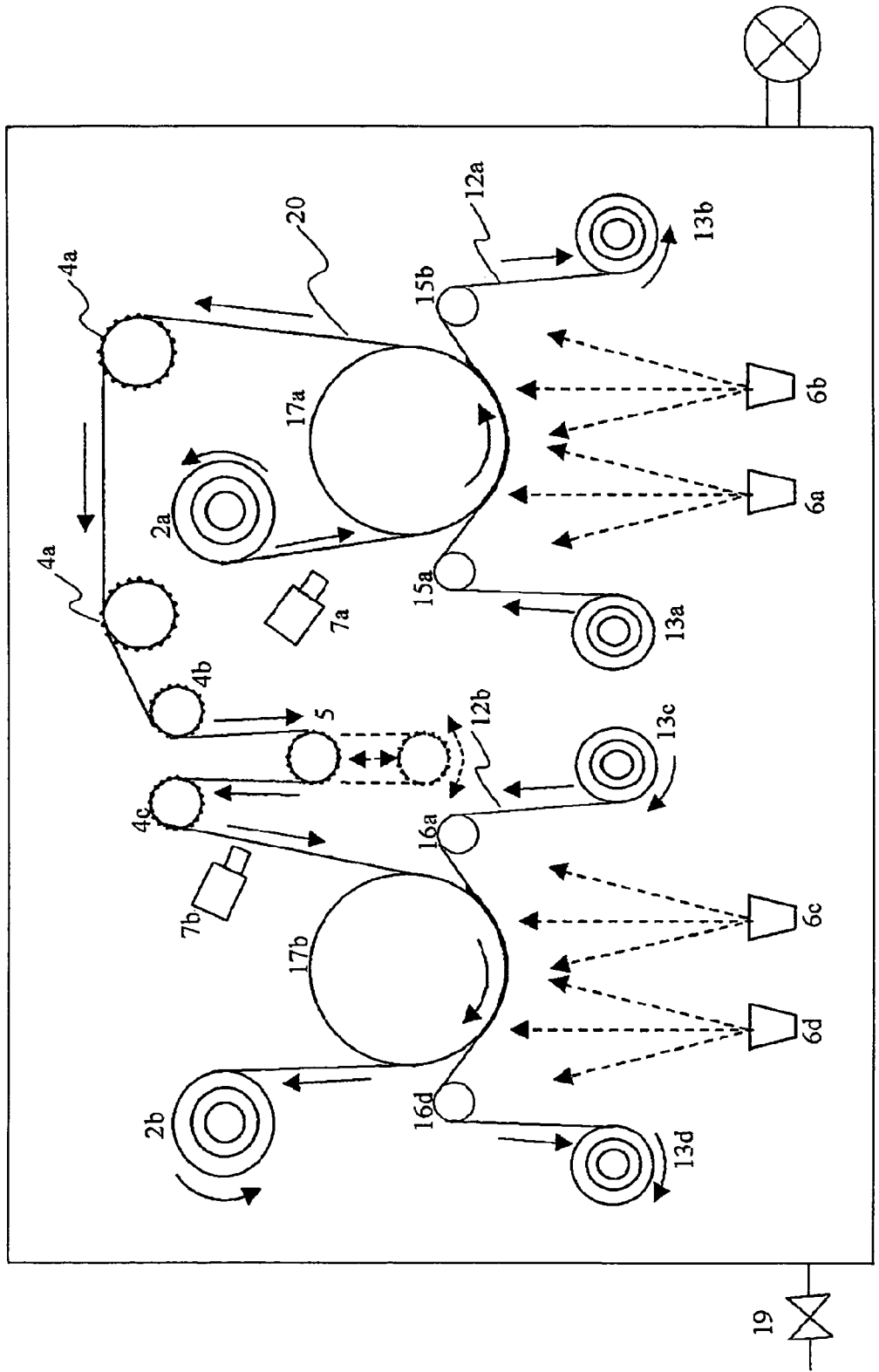
FIG. 10 is a schematic diagram showing part of the internal configuration of the vacuum deposition apparatus used in the second comparative example.

With reference to FIG. 10, there is shown the internal configuration of the vacuum deposition apparatus used in the second comparative example for forming anodes on both sides of the copper foil in the vacuum throughout the process. The rollers for procedures from the feed to the take-up of the copper foil 20 include a feed roller 2a for the copper foil 20, a can roller 17a for depositing evaporated substance from the evaporation sources 6a and 6b while maintaining close contact between the copper foil 20 and the pattern mask 12a or 12b, two guide rollers 4a provided for accurately moving the copper foil 20 fed from the can roller 17a to direct the bottom surface of the copper foil 20 toward the evaporation sources 6c and 6d, a dancer roller 5 capable of changing the speed of the copper foil 20 fed from the guide rollers 4a and provided for depositing on the specified position of the bottom surface, a guide roller 4b having a role for transferring the copper foil 20 to the dancer roller 5, a guide roller 4c for accurately transferring the copper foil 20 fed from the dancer roller 5 to a can roller 17b, the can roller 17b for depositing evaporated substance from the evaporation sources 6c and 6d onto the bottom surface of the copper foil 20 while maintaining close contact between the copper foil 20 fed from the dancer roller 5 and the pattern mask 12b, and a take-up roller 2b for winding the copper foil 20, which is fed from the can roller 17b and on both the surfaces of which SiLi layers are patterned.

The rollers for procedures from the feed to the take-up of the pattern mask 12a for patterning on the top surface of the copper foil 20 include a feed roller 13a for feeding the pattern mask, a guide roller 15a disposed for guiding the pattern mask 12a toward the can roller 17a, a guide roller 15b for guiding the pattern mask 12a fed from the guide roller 15a toward a take-up roller 13b, and the take-up roller 13b for winding the pattern mask fed from the guide roller 15b. The rollers for procedures from the feed to the take-up of the pattern mask 12b for patterning on the bottom surface of the copper foil 20 include a feed roller 13c for feeding the pattern mask, a guide roller 16a for guiding the pattern mask toward the can roller 17b, a guide roller 16b for guiding the pattern mask fed from the can roller 17b toward a take-up roller 13d, and the take-up roller 13d for winding the pattern mask fed from the guide roller 16b.

On the graphite layers 21a patterned on both the surfaces of the copper foil, an active material made of SiLi was pattern-deposited using a vacuum evaporation process. As an initial state of arrangement of the copper foil 20, the wound core of the copper foil 20 prepared in advance was attached onto the feed roller 2a shown in FIG. 10, and at the same time, the copper foil 20 was moved along the can roller 17a→guide roller 4a→guide roller 4b→dancer roller 5→can roller 17b, thereby attaching the front end of the copper foil 20 to the take-up roller 2b.

As an initial state of arrangement of the pattern masks 12a and 12b, the pattern masks 12a and 12b are moved along the guide roller 15a and 16a→can rollers 17a and 17b→guide rollers 15b and 16b, thereby attaching the same onto the take-up rollers 13b and 13d. In addition, the alignment marks 22 of the pattern masks 12a and 12b are aligned with the alignment marks 22 of the copper foil, which is applied with tension to assume the initial state.

The vacuum evacuation device 18 was operated to evacuate the vacuum chamber down to a degree of vacuum at $1 \times 10^{-4}$ Pa, followed by effecting deposition.

By driving all the rollers, the copper foil 20 and pattern masks 12a and 12b were carried at an arbitrary speed in synchrony with each other, and SiLi was continuously evaporated from the evaporation sources without using a shutter mechanism. The pattern mask was cut-off, after effecting deposition for about 1200 m on the top side of the copper foil 20, and after effecting deposition for about 1100 m on the bottom side. After the deposition, Ar gas was introduced using the gas inlet valve into the chamber, followed by opening the chamber and extracting therefrom the copper foil 20 wound on the take-up roller 2b.

Observation of the pattern on the successfully deposited portion of the copper foil 20 proved absence of the SiLi layer on a portion of the graphite layer, and presence of the SiLi layer on the area other than the graphite. This is because misalignment occurred between the copper foil 20 and the pattern mask 12a during the carriage. In addition, a scratch or peel-off was observed on a part of the surface of the layer on the copper foil 20. This is because the layer is scratched upon occurring of the misalignment during the carriage in close contact between the copper foil 20 and the pattern mask 12a. The copper foil 20, which was wound on the take-up roller 2b and on which the deposition for 500 m was achieved, was extracted.

As described above, the conventional deposition process synchronizing (carrying) the pattern mask and the copper foil with each other could not achieved patterning for the secondary battery electrode.

As described heretofore, according to the present invention, the deposition is effected by intermittently blocking the movement of the evaporated substance from the evaporation source to the substrate by using the blocking member such as the shutter mechanism. As a result, a film having a desired shape of pattern is stably formed with a superior controllability. The blocking member, as disposed apart from the substrate, effectively solves the problems of the displacement of the film, the contamination caused by the peel-off of the film, attached onto the mask, during the carriage, and the cut-off of the substrate during the deposition, which are involved in the conventional technique using the mask.

The present invention can be applied to battery electrodes, secondary batteries, a variety of packing films, a variety of sealing films, coating glasses, magnetic recording disks, organic electroluminescent devices, inorganic film electroluminescent devices, film capacitors etc.

The invention claimed is:

1. A vacuum deposition apparatus comprising:
   a feed roller for feeding therefrom a substrate;
   a take-up roller for winding the substrate fed by said feed roller;
   plural evaporation sources that each includes a substance to be evaporated to deposit on the substrate for vacuum deposition;
   plural evaporated substance supply members for guiding the evaporated substances to the substrate and being disposed between the evaporation sources and the substrate, wherein the evaporated substance supply members have plural slit openings on a side nearest the substrate; and
   plural shutters disposed between respective said evaporated substance supply members and respective said evaporation sources for intermittently blocking movement of the evaporated substances from said evaporation sources to the substrate.

2. The vacuum deposition apparatus according to claim 1, further comprising a guide roller between said feed roller and said take-up roller.

3. The vacuum deposition apparatus according to claim 1, further comprising a dancer roller between said feed roller and said take-up roller.

4. The vacuum deposition apparatus according to claim 1, further comprising a position sensor between said feed roller and said take-up roller for determining a position of the substrate.

5. The vacuum deposition apparatus according to claim 1, wherein said evaporation sources include different substances to be evaporated.

* * * * *